United States Patent
Kim et al.

(10) Patent No.: US 10,557,888 B2
(45) Date of Patent: Feb. 11, 2020

(54) TEST APPARATUS

(71) Applicants: SK hynix Inc., Icheon (KR); KOREA UNIVERSITY RESEARCH AND BUSINESS FOUNDATION, Seoul (KR)

(72) Inventors: Chul Woo Kim, Seoul (KR); Dong Yoon Kim, Seoul (KR); In Hwa Jung, Hwaseong (KR); Yong Ju Kim, Seoul (KR)

(73) Assignee: SK HYNIX INC., Icheon (KR)

( * ) Notice: Subject to any disclaimer, the term of this patent is extended or adjusted under 35 U.S.C. 154(b) by 304 days.

(21) Appl. No.: 15/650,403

(22) Filed: Jul. 14, 2017

(65) Prior Publication Data

US 2018/0156870 A1    Jun. 7, 2018

(30) Foreign Application Priority Data

Dec. 7, 2016 (KR) .......... 10-2016-0165760

(51) Int. Cl.
*G01R 31/319* (2006.01)
*G06F 11/22* (2006.01)
(Continued)

(52) U.S. Cl.
CPC ..... *G01R 31/31905* (2013.01); *G01R 31/286* (2013.01); *G01R 31/3167* (2013.01); *G01R 31/31926* (2013.01); *G06F 11/22* (2013.01)

(58) Field of Classification Search
CPC ............ G01R 31/31905; G01R 31/286; G01R 31/3167; G01R 31/31926; H03K 5/132; G06F 11/22; H03L 7/085
USPC .......... 324/500, 750.01, 300, 314, 600, 637, 324/639, 76.11, 76.26, 76.35, 76.54, 617, 324/621, 750.15, 756.02; 365/189.09, 365/194, 233.1; 327/250, 158, 175, 155, 327/355, 149, 116, 144
See application file for complete search history.

(56) References Cited

U.S. PATENT DOCUMENTS

2008/0012549 A1* 1/2008 Kam ............... G01R 29/26
                                                   324/76.54
2008/0252341 A1* 10/2008 Kim ................. G06F 1/04
                                                    327/157

FOREIGN PATENT DOCUMENTS

KR    10-0897349 B1    5/2009
KR    10-2015-0080060 A   7/2015
KR    10-2016-0046259 A   4/2016

* cited by examiner

*Primary Examiner* — Melissa J Koval
*Assistant Examiner* — Trung Nguyen (57) ABSTRACT

A test apparatus may include transceivers and a global de-skew circuit. In a training mode, the transceivers provide first timing information obtained by delaying a first data signal in the range of up to a preset unit interval based on a clock signal and receive second timing information corresponding to timing differences between a slowest transceiver and the remaining transceivers. In an operation mode, the transceivers provide compensation data to a plurality of DUTs (Devices Under Test) substantially simultaneously. The compensation data may be obtained by delaying a second data signal by multiples of the preset unit interval in response to the second timing information. In the training mode, the global de-skew circuit receives the first timing information, calculates, using the first timing information, the timing differences between the slowest transceiver and the remaining transceivers, and provides the second timing information corresponding to the timing differences to the transceivers.

14 Claims, 5 Drawing Sheets

(51) Int. Cl.
*G01R 31/28* (2006.01)
*G01R 31/3167* (2006.01)

TEST APPARATUS

CROSS-REFERENCE TO RELATED APPLICATIONS

The present application claims priority of Korean Patent Application No. 10-2016-0165760, filed on Dec. 7, 2016, which is incorporated herein by reference in its entirety.

BACKGROUND

1. Field

Exemplary embodiments of the present invention relate to a test apparatus, and more particularly, to an apparatus that tests a plurality of devices under test (DUTs) through a BOST (Built-Out Self-Test) at the same time.

2. Description of the Related Art

In general, a BOST apparatus refers to a test apparatus that applies the same signal to all input pins of a plurality of DUTs at the same timing, and tests performances and errors of the plurality of DUTs.

However, when a data signal is transmitted to the DUTs, a skew may occur due to the lengths of channels carrying the data signal to the respective DUTs, PVT variations, or mismatch between pins.

The conventional test apparatus corrects all skews occurring in the respective channels using a DLL (Delay Locked Loop), but consumes a large amount of power due to a wide delay range of the DLL. In particular, a power drop (that is, a local reduction in a supply voltage) may occur in an operation mode for transmitting a data signal at high speed.

Thus, in the conventional test apparatus, the delay of the DLL in each of the channels may differ due to the power drop. In this case, a de-skew operation between the channels may not be performed in a normal manner, which makes it difficult to accurately test performances and errors of the DUTs.

SUMMARY

Various embodiments are directed to a test apparatus capable of accurately testing a plurality of DUTs at the same time by performing a de-skew operation between channels.

In an embodiment, a test apparatus may include: transceivers suitable for providing first timing information obtained by delaying a first data signal in the range of a preset unit interval based on a clock signal and receiving second timing information corresponding to timing differences between the slowest transceiver and remaining transceivers in a training mode, and providing compensation data to a plurality of DUTs (Devices Under Test) at the same time in an operation mode, the compensation data being obtained by delaying a second data signal by multiples of the preset unit interval in response to the second timing information; and a global de-skew circuit suitable for receiving the first timing information, calculating the timing differences between the slowest transceiver and the remaining transceivers in response to the first timing information, and providing the second timing information corresponding to each of the timing differences to the transceivers, in the training mode.

In an embodiment, a test apparatus may include: transceivers each including a DLL suitable for delaying a first data signal in the range of a preset unit interval based on a clock signal, an encoder suitable for providing first timing information corresponding to the first data signal delayed by the DLL, a local de-skew circuit suitable for delaying a second data signal by a multiple of the preset unit interval in response to second timing information corresponding to a timing difference from the slowest transceiver; and a global de-skew circuit suitable for receiving the first timing information, calculating timing differences between the slowest transceiver and remaining transceivers in response to the first timing information, and providing the second timing information corresponding to each of the timing differences to the local de-skew circuits.

According to embodiments of the invention, since the delay of the DLL is limited to the present unit interval, the test apparatus can prevent an occurrence of power drop when testing a plurality of DUTs at the same time.

Furthermore, since the de-skew operation between channels is normally performed, the plurality of DUTs can be accurately tested at the same time.

Furthermore, since the size of the delay line of the DLL can be reduced, the chip size can be significantly reduced in terms of design.

Furthermore, regardless of a frequency change of the PLL, the test apparatus can test the DUTs in various frequency bands at the same time.

DETAILED DESCRIPTION

Hereafter, embodiments of the present invention will be described in detail with reference to the accompanying drawings. The terms used in the present specification and claims are not limited to typical dictionary definitions, but should be interpreted into meanings and concepts which coincide with the technical idea of the present invention.

Embodiments described in the present specification and configurations illustrated in the drawings are preferred embodiments of the present invention, and do not represent the entire technical idea of the present invention. Thus, various equivalents and modifications capable of replacing the embodiments and configurations may be provided at the point of time that the present application is filed.

Figure 1:
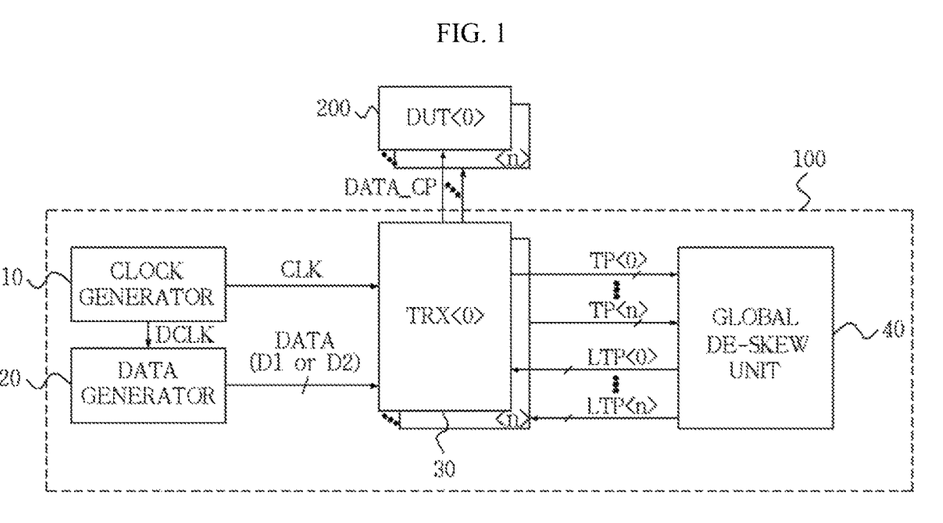
FIG. 1 is a block diagram of a test apparatus in accordance with an embodiment.

FIG. 1 is a block diagram of a test apparatus 100 in accordance with an embodiment.

Referring to FIG. 1, the test apparatus 100 in accordance with the present embodiment includes a clock generator 10, a data generator 20, a plurality of transceivers 30 (including bidirectional transceivers TRX<0> to TRX<n>, where n is greater than 1), and a global de-skew circuit 40. In an embodiment, the clock generator 10, the data generator 20, the plurality of transceivers 30, and the global de-skew circuit 40 are each circuits.

The clock generator 10 generates a clock signal CLK, and provides the generated clock signal CLK to the bidirectional transceivers TRX<0> to TRX<n>. For example, the clock generator 10 may be configured to provide the clock signal CLK of 4.5 GHz.

The data generator 20 generates a data signal DATA, and provides the generated data signal DATA to the bidirectional transceivers TRX<0> to TRX<n>. The data generator 20 may be configured to provide data at different frequencies depending on a training mode and an operation mode, as the data signal DATA. For example, the data generator 20 may be configured to provide a first data signal D1 of 100 MHz as the data signal DATA in the training mode, and provide a second data signal D2 of 4.5 GHz as the data signal DATA in the operation mode.

The transceivers TRX<0> to TRX<n> delay the data signal DATA in the range of a predetermined unit interval (UI) through a DLL 32 (illustrated in FIG. 3) in the training mode such that the data signal DATA is synchronized with the clock signal CLK, and provides first timing information TP<0> to TP<n> corresponding to the delayed data signals of the respective transceivers TRX<0> to TRX<n> to the global de-skew circuit 40. For example, the unit interval may be set to a UI corresponding to a period of a 9 Gbps rate (that is, the UI may correspond to 111 picoseconds).

The global de-skew circuit 40 receives the first timing information TP<0> to TP<n> corresponding to the data signals delayed by the respective transceivers TRX<0> to TRX<n> in the training mode, and provides second timing information LTP<0> to LTP<n> corresponding to timing differences with the slowest transceiver to the respective transceivers TRX<0> to TRX<n>. For example, in an embodiment, the global de-skew circuit 40 determines a slowest timing information $T_{SLOW}$ from among the first timing information TP<0> to TP<n> according to:

$$T_{SLOW}=MAX(TP<0>, \ldots ,TP<n>),$$

and generates the second timing information LTP<0> to LTP<n> using a difference between the respective first timing information TP<0> to TP<n> and the slowest timing information $T_{SLOW}$:

$$LTP<x>=T_{SLOW}-TP<x>, x=0 \ldots n.$$

The transceivers TRX<0> to TRX<n> delay the data signal DATA by multiples of the unit interval, corresponding to the respective values of second timing information LTP<0> to LTP<n>, through local de-skew circuits 44 (illustrated in FIG. 3) in the operation mode, and provide de-skewed compensation data DATA_CP to a plurality of DUTs 200. For example, the transceivers TRX<0> to TRX<n> delay the data signal DATA by the multiples of the unit interval, corresponding to the respective values of second timing information LTP<0> to LTP<n>.

The training mode may be understood as an operation period for obtaining timing information of the channels corresponding to the transceivers TRX<0> to TRX<n>, and the operation mode may be understood as an operation period for substantially testing the DUTs 200.

Figure 2:
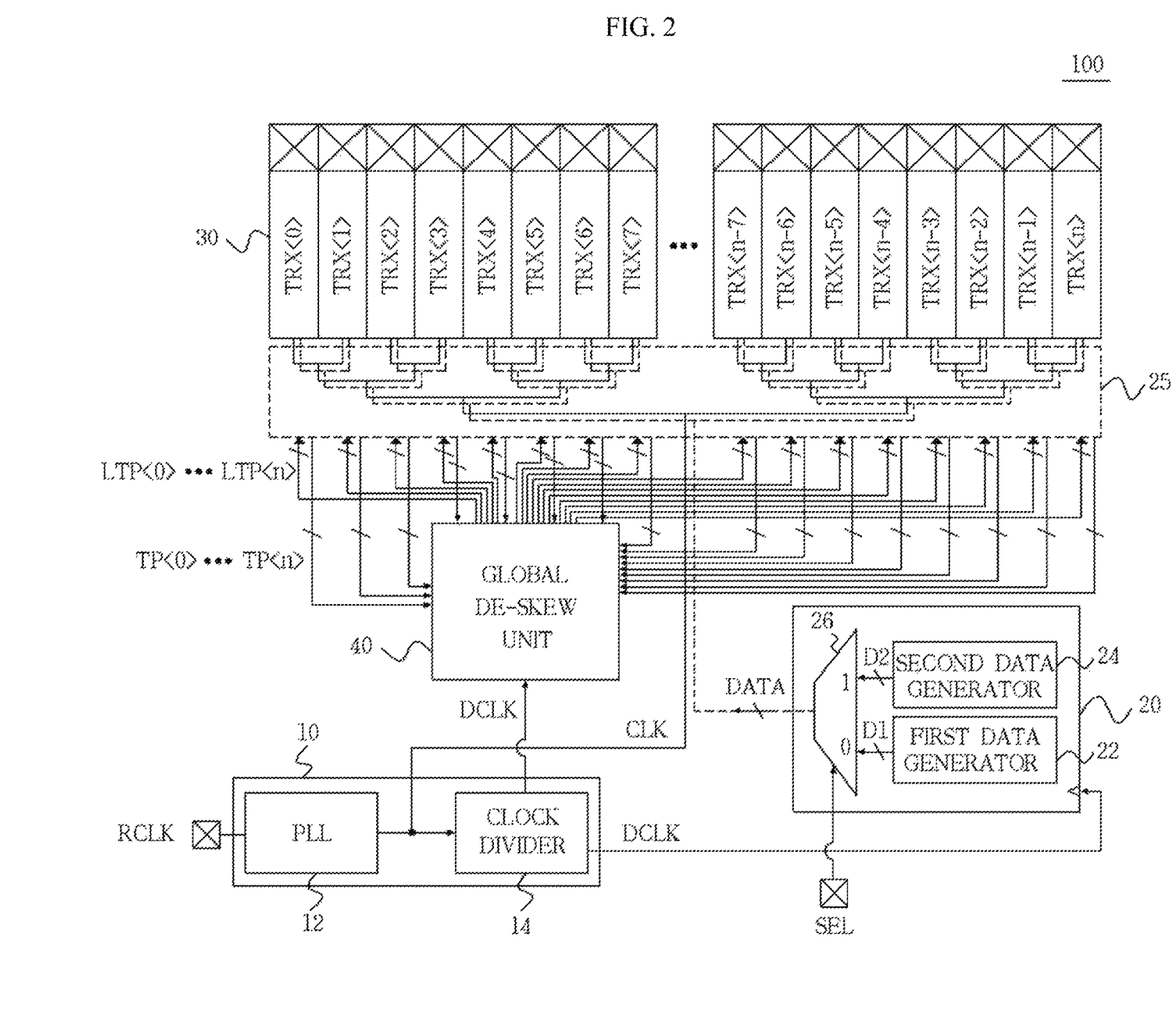
FIG. 2 is a detailed block diagram of the test apparatus in accordance with an embodiment.

FIG. 2 is a detailed block diagram of the test apparatus 100 in accordance with the present embodiment.

Referring to FIG. 2, the test apparatus 100 in accordance with the present embodiment includes the clock generator 10, the data generator 20, a clock and data tree 25, a plurality of transceivers 30 including the transceivers TRX<0> to TRX<n>, and the global de-skew circuit 40.

The clock generator 10 includes a PLL (Phase Locked Loop) 12 and a clock divider 14. The PLL 12 generates the clock signal CLK using a reference clock signal RCLK and provides the generated clock signal CLK to the each of the plurality of transceivers 30, and the clock divider 14 divides the clock signal CLK and provides the divided clock signal DCLK to the data generator 20. For example, the PLL 12 may be configured to provide the clock signal CLK of 4.5 GHz, and the clock divider 14 may be configured to provide the divided clock signal DCLK of 562.5 MHz, obtained by dividing the clock signal CLK of 4.5 GHz by eight.

The data generator 20 includes a first data generator 22, a second data generator 24 and a selector 26. The first data generator 22 provides first data D1 as the data signal DATA in the training mode. The second data generator 24 provides second data D2 as the data signal DATA in the operation mode. The selector 26 selects one of the first and second data D1 and D2 according to a select signal SEL and provides the selected data to the transceiver 30. For example, the data generator 20 may be configured to provide the first data signal D1 having a 100 MHz frequency as the data signal DATA in the training mode, and provide the second data signal D2 having a 4.5 GHz frequency as the data signal DATA in the operation mode.

The clock and data tree 25 serves as a medium for transmitting the clock signal CLK produced by the clock generator 10 and the data signal DATA produced by the data generator 20 to the transceivers TRX<0> to TRX<n>.

In the training mode, the transceivers TRX<0> to TRX<n> delay the data signal DATA in a range of up to 1 UI of, for example, of up to 111 picoseconds, the 111 picoseconds corresponding to a period of a 9 Gbps signal, through the DLL 32 (illustrated in FIG. 3) such that the data signal DATA is synchronized with the clock signal CLK, and provides the first timing information TP<0> to TP<n> corresponding to the delayed data signals to the global de-skew circuit 40. For example, the transceivers TRX<0> to TRX<n> may delay the data signal DATA by respective amounts equal to $X_n \cdot T_{UI}/N_{DLL}$, where $N_{DLL}$ corresponds to a number of delay amounts available in the DLL 32, $T_{UI}$ is the duration of the UI, and the respective $X_n$ are each in the range of 0 to $N_{DLL}$. The delay used to synchronize the data signal DATA with the clock signal CLK in the training mode may be retained for later use in the operation mode. In accordance with the present embodiment, since the delay of the DLL 32 is limited to the range of up to 1 UI of a 9 Gbps signal, power consumed by the DLL is reduced, and the test apparatus can prevent a power drop in the operation mode for testing the plurality of DUTs while at the same time using high-speed data signals.

In the operation mode, the transceivers TRX<0> to TRX<n> delay the data signal DATA by the multiples of the unit interval, corresponding to the respective values of second timing information LTP<0> to LTP<n>, through the local de-skew circuits 44 (illustrated in FIG. 3), and provides de-skewed compensation data DATA_CP to the plurality of DUTs 200. For example, the local de-skew circuit 44 may include D flip-flops.

In the training mode, the global de-skew circuit 40 receives the first timing information TP<0> to TP<n> corresponding to the data signals delayed by the respective transceivers TRX<0> to TRX<n>, and provides the second timing information LTP<0> to LTP<n> corresponding to the respective timing differences between the a transceivers TRX<0> to TRX<n> and a slowest transceiver to the respective transceivers TRX<0> to TRX<n>.

Figure 3:
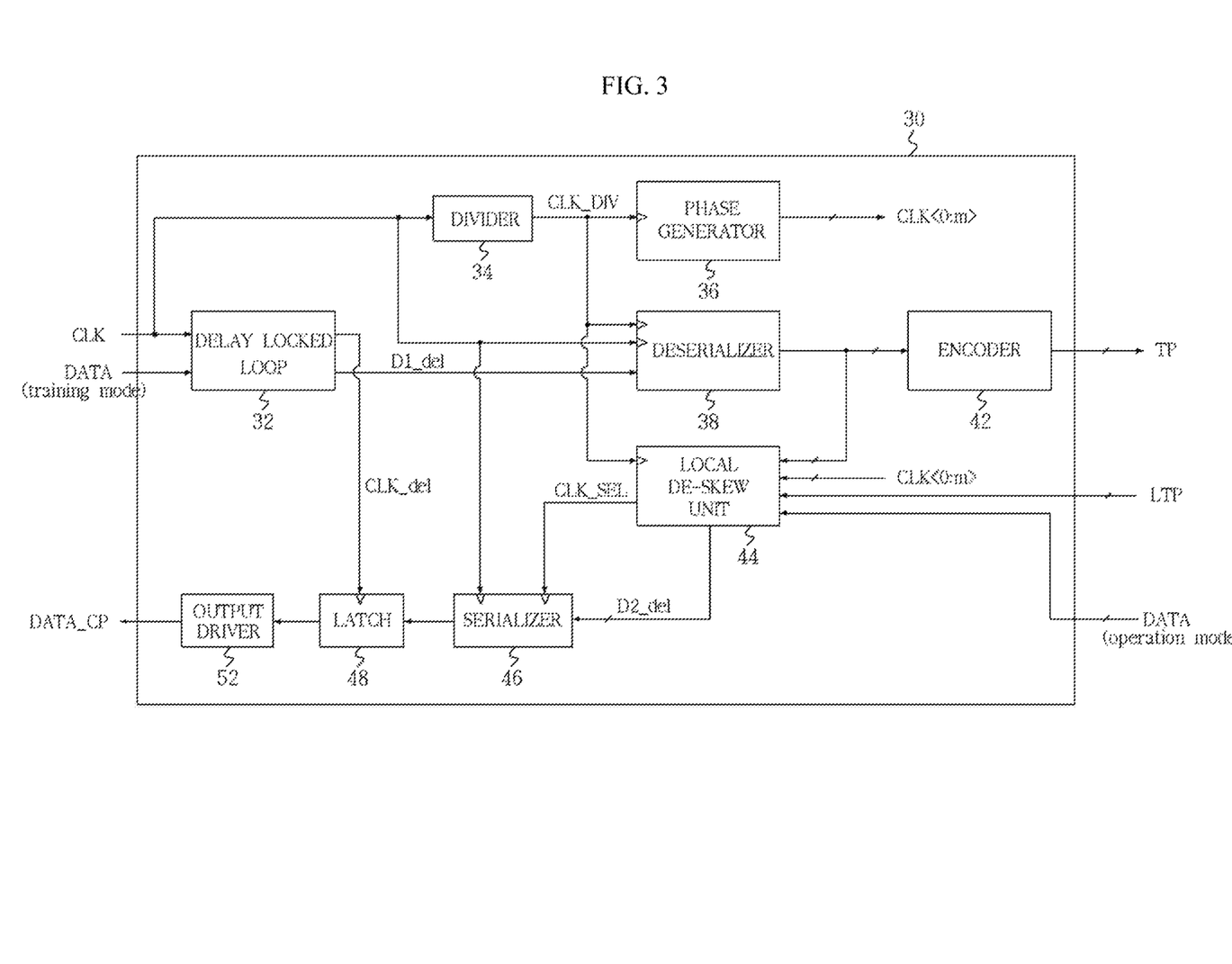
FIG. 3 is a block diagram of a transceiver in the test apparatus in accordance with an embodiment.

FIG. 3 is a block diagram illustrating a transceiver of the test apparatus in accordance with the embodiment.

Referring to FIG. 3, the transceiver 30 of the test apparatus in accordance with the present embodiment includes a DLL 32, a divider 34, a phase generator 36, a deserializer 38, an encoder 42, a local de-skew circuit 44, a serializer 46, a latch 48 and an output driver 52.

The DLL 32 receives the clock signal CLK and the data signal DATA in the training mode, delays the data signal DATA in the range of up to the unit interval such that the data signal DATA is synchronized with the clock signal, and provides the delayed data signal D1_del to the deserializer 38. In an embodiment, the DLL 32 may include a delay line to delay the data signal in the range of 0 to 111 picoseconds, the 111 picoseconds corresponding to a period of a 9 GHz frequency.

In the operation mode, the DLL 32 delays the clock signal CLK by the delay value determined during the training mode in order to generate the delayed clock signal CLK_del that is provided to the latch 48.

The divider 34 divides the clock signal CLK and provides the divided clock signal CLK_DIV to the phase generator 36, the deserializer 38 and the local de-skew circuit 44. For example, the divider 34 may be configured to provide the divided signal CLK_DIV of 562.5 MHz, obtained by dividing the clock signal CLK of 4.5 GHz by eight.

The phase generator 36 generates multi-phase clock signals CLK<0:m> having a preset phase difference therebetween in response to the divided clock signal CLK_DIV in the training mode, and provides the multi-phase clock signals CLK<0:m> to the local de-skew circuit 44 in the operation mode. For example, the phase difference between the multi-phase clock signals CLK<0:m> may be set to a UI corresponding to a period of a 9 GHz frequency, that is, to a UI of 111 picoseconds. For example, the phase generator 36 may include a delay line for delaying the divided clock signal CLK_DIV and a phase detector for outputting a detection signal by comparing the phase of an output signal of the delay line to the phase of the divided clock signal CLK_DIV. Here, m corresponds to the number of bits contained in the second data signal D2 of FIG. 1. For example, when the 16-bit second data signal D2 is provided in the operation mode, the phase generator 36 may be configured to generate multi-phase clock signals CLK<0:15> having a phase difference corresponding to 1 UI of a 9 GHz frequency.

Since the phase generator 36 generates the multi-phase clock signals CLK<0:m> in the training mode and provides the multi-phase clock signals CLK<0:m> to the local de-skew circuit 44 in the operation mode, the DUTs 200 can be tested in various frequency bands at the same time, regardless of a frequency change of the PLL 12.

The deserializer 38 converts the data signal D1_del delayed by the DLL 32 into parallel data in response to the clock signal CLK and the divided clock signal CLK_DIV, in the training mode. In an embodiment, the deserializer 38 shifts values of the data signal D1_del into a serial shift register at a rate determined by the clock signal CLK, and transfers, in parallel, the values of the bits of the serial shift register to an output register in response to a transition of a value of the divided clock signal CLK_DIV. Accordingly, in the example embodiment, a value of the parallel data output by the deserializer 38 corresponds to sequential samples of the data signal D1_del taken between transitions of the value of the divided clock signal CLK_DIV.

The encoder 42 encodes the parallel data of the deserializer 38 in the training mode, and provides the first timing information TP to the global de-skew circuit 40. In an embodiment, the encoder 42 generates a value corresponding to a number of least-significant bits of the parallel data have a same predetermined value, which corresponds to a delay between a transition of the value of the divided clock signal CLK_DIV and a transition of the value of the data signal D1_del. That is, the encoders 42 of the respective transceivers TRX<0> to TRX<n> provide the first timing information TP<0> to TP<n> corresponding to the data signals D1_del delayed by the DLLs 32 to the global de-skew circuit 40.

The local de-skew circuit 44 receives the second timing information LTP corresponding to a timing difference from the slowest transceiver and stores the received information, in the training mode. Furthermore, the local de-skew circuit 44 delays the data signal DATA by a multiple of the unit interval through logic circuits such as D flip-flops 442 (illustrated in FIG. 5) in response to the second timing information LTP and provides the delayed data signal D2_del to the serializer 46, in the operation mode. For example, when the timing difference from the slowest transceiver is N*UI where N is an integer, the local de-skew circuit 44 delays the data signal DATA by N*UI through the logic circuits such as D flip-flops.

The local de-skew circuit 44 selects one of the multi-phase clock signals CLK<0:m> through a clock selector 444 (illustrated in FIG. 5) and provides the selected phase clock signal CLK_SEL to the serializer 46, in the operation mode.

The serializer 46 converts the delayed second data signal D2_del into serial data in response to the clock signal CLK and the phase clock signal CLK_SEL selected by the clock selector 444, in the operation mode. In an embodiment, the serializer 46 latches the second data signal D2_del into a shift register in response to a transition of a value of the phase clock signal CLK_SEL and shifts the values out of the shift register in a serial manner at a rate determined by the clock signal CLK.

The latch 48 latches the serial data of the serializer 46 in response to the clock signal CLK_del delayed by the DLL 32 in the operation mode, and the output driver 52 provides de-skewed compensation data DATA_CP to the DUT 200 in response to the serial data of the latch 48 in the operation mode. Accordingly, in the operation mode, respective total delay of the data signal DATA used by the transceivers TRX<0> to TRX<n> to produce de-skewed compensation data DATA_CP is equal to a sum of the delays, in increments of 1 UI, provided by the respective local de-skew circuits 44 and the delays, in the range of 0 to 1 UI, generated by the respective DLLs 32.

Figure 4:
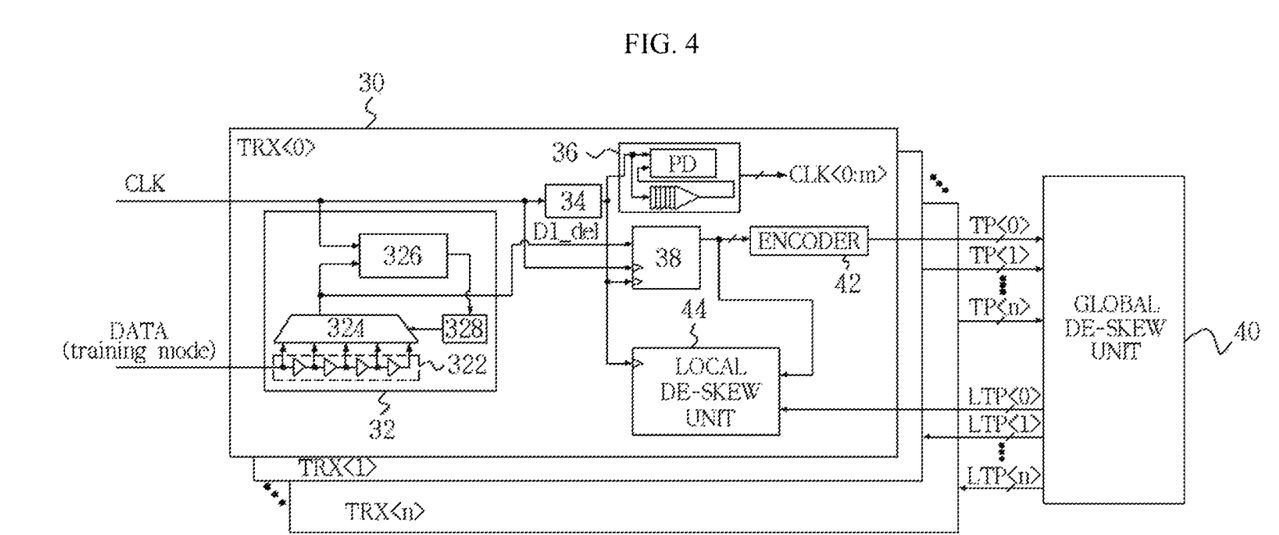
FIG. 4 is a block diagram for describing an operation of the test apparatus in a training mode in accordance with an embodiment.

FIG. 4 is a block diagram for describing the operation of the test apparatus 100 in the training mode in accordance with the present embodiment. The training mode may be understood as a mode for obtaining the timing information of the channels corresponding to the transceivers TRX<0> to TRX<n>.

Referring to FIG. 4, the DLL 32 includes a delay line 322, a multiplexer 324, a phase detector 326 and a controller 328, and receives the clock signal CLK and the data signal DATA in the training mode.

The delay line 322 delays the data signal DATA through delay cells and outputs a plurality of delayed signals, and the multiplexer 324 selects and outputs one of the plurality of delayed signals according to control of the controller 328. The phase detector 326 compares the phase of the clock signal CLK to the phase of the selected delayed signal and provides a signal corresponding to the comparison result to the controller 328, and the controller 328 provides a select signal to the multiplexer 324.

The DLL 32 delays the data signal DATA in the range of up to the unit interval such that a difference between the data signal DATA and the clock signal CLK corresponds to a multiple of the unit interval, and provides the delayed data signal D1_del to the deserializer 38. In an embodiment, the delay provided by the DLL 32 may range from a minimum delay in the multiplexer 324 to a sum of the minimum delay in the multiplexer 324 and the maximum delay provided by the delay line 322, in increments substantially equal to the delay of the delay cells of the delay line 322.

The deserializer 38 converts the data signal D1_del delayed by the DLL 32 into parallel data in response to the clock signal CLK and the divided clock signal CLK_DIV in the training mode, and the encoder 42 encodes the parallel data of the deserializer 38 and provides the first timing information TP<x>, x=0 . . . n, to the global de-skew circuit 40 in the training mode.

The global de-skew circuit 40 receives the first timing information TP<0> to TP<n> corresponding to the delayed data signals from the respective transceivers TRX<0> to TRX<n>, calculates the second timing information LTP<0> to LTP<n> corresponding to timing differences with a slowest transceiver and the respective transceivers TRX<0> to TRX<n>, and provides the second timing information LTP<0> to LTP<n> to the respective transceivers TRX<0> to TRX<n>, in the training mode.

The local de-skew circuits 44 receive the second timing information LTP<0> to LTP<n> corresponding to the timing differences with the slowest transceiver and store the received information, in the training mode.

The phase generator 36 generates the multi-phase clock signals CLK<0:m> having a preset phase difference in response to the divided clock signal CLK_DIV and stores the generated signals, in the training mode. The phase difference between the multi-phase clock signals CLK<0:m> may be set to 1 UI of a 9 GHz frequency.

Figure 5:
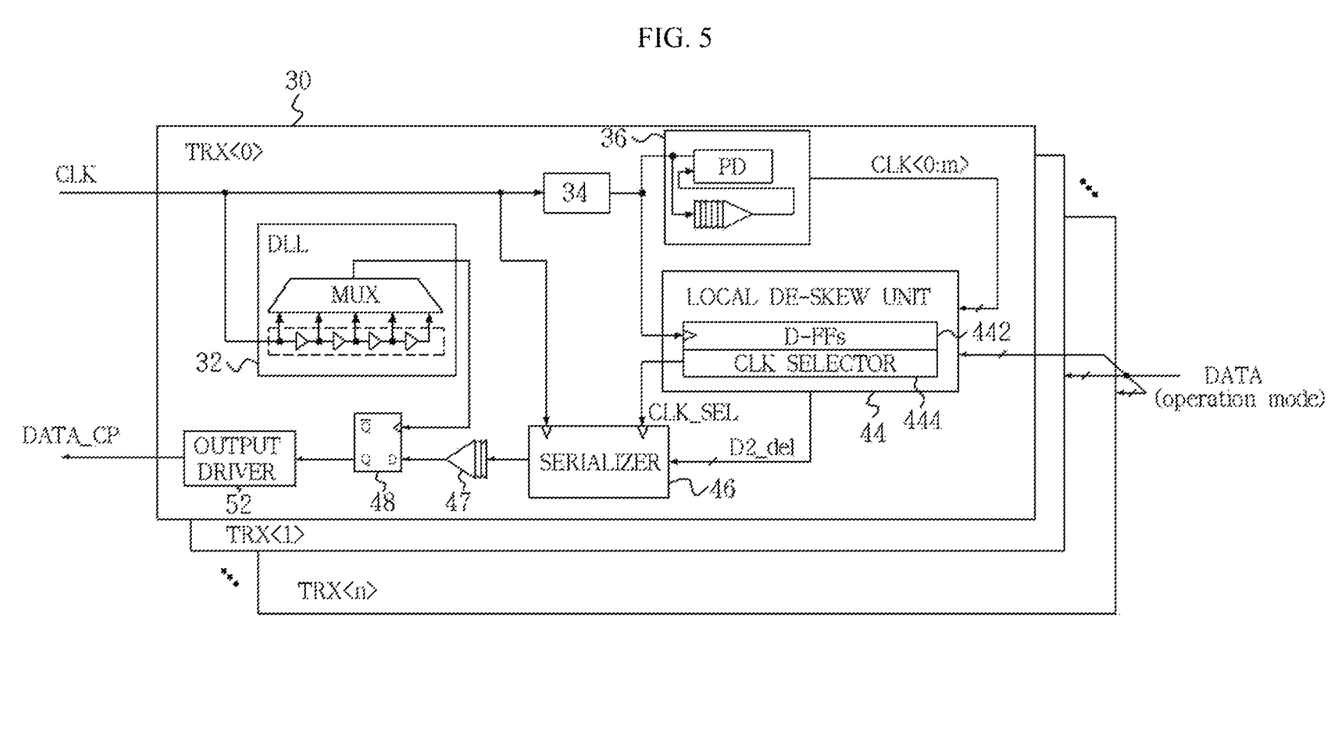
FIG. 5 is a block diagram for describing an operation of the test apparatus in an operation mode in accordance with an embodiment.

FIG. 5 is a block diagram for describing the operation of the test apparatus in the operation mode in accordance with the present embodiment. The operation mode may be understood as a mode for testing the DUTs 200 substantially at the same time.

Referring to FIG. 5, in the operation mode, the DLL 32 delays the clock signal CLK by a delay value determined in and retained from the training mode and provides the delayed clock signal CLK_del to the latch 48.

In the operation mode, the local de-skew circuits 44 delay the data signal DATA by the multiples of the unit interval through the D flip-flops 442 in response to the respective second timing information LTP<0> to LTP<n> corresponding to the timing differences with the slowest transceiver, and provide the delayed data signals D2_del to the serializer 46.

The phase generator 36 provides the multi-phase clock signals CLK<0:m> to the local de-skew circuit 44 in the operation mode, and the local de-skew circuit 44 selects one of the multi-phase clock signals CLK<0:m> through the clock selector 444 and provides the selected phase clock signal CLK_SEL to the serializer 46 in the operation mode. Such a configuration can support the operation of testing the DUTs 200 in various frequency bands at the same time, regardless of a frequency change of the PLL 12.

In the operation mode, the serializer 46 converts the delayed second data signal D2_del into serial data in response to the clock signal CLK and the phase clock signal CLK_SEL selected by the clock selector 444.

In the operation mode, the latch 48 latches the serial data of the serializer 46 in response to the clock signal CLK_del delayed by the DLL 32, and the output driver 52 provides de-skewed compensation data DATA_CP to the DUTs 200 in response to the serial data of the latch 48.

As described above, the operation of the test apparatus 100 in accordance with the present embodiment may be divided into 1) the training mode for obtaining the timing information of the channels corresponding to the transceivers TRX<0> to TRX<n>, and 2) the operation mode for testing the DUTs 200 substantially at the same time.

In accordance with the present embodiment, the DLL 32 delays the data signal DATA in the range of up to the unit interval such that a difference between the data signals DATA and the clock signal CLK correspond to a multiple of the unit interval. Thus, the test apparatus 100 can prevent an occurrence of power drop when testing the plurality of DUTs at the same time. Furthermore, the size of the delay line of the DLL can be reduced, which makes it possible to significantly reduce the chip area in terms of design.

Furthermore, the local de-skew circuits 44 delay the data signal DATA by N*UI, where N is a natural number and UI is the duration of the unit interval, in response to the second timing information LTP<0> to LTP<n> corresponding to the timing differences with the slowest transceiver. The total delay of the data signal DATA is equal to the delay N*UI provided by the local de-skew circuits 44 and the delay, in the range of up to one UI, used to produce the corresponding clock signal CLK_del. Thus, since the de-skew operation between the channels is normally performed, the plurality of DUTs can be accurately tested at the same time.

Furthermore, the phase generator 36 can generate the multi-phase clock signals CLK<0:m> having a phase difference of the unit interval in the operation mode, and use the generated signals to output the compensation data DATA_CP. Thus, regardless of a frequency change of the PLL, the DUTs can be simultaneously tested in various frequency bands.

The test apparatus in accordance with the present embodiment is configured to provide a pattern data signal of 100 MHz in the test mode. However, the test apparatus may be configured to acquire the second timing information corresponding to timing differences with the slowest transceiver by providing a pattern data signal of 100 MHz, and lock the delay of the DLLs by providing a data signal of 4.5 GHz.

Although various embodiments have been described for illustrative purposes, it will be apparent to those skilled in the art that various changes and modifications may be made without departing from the spirit and scope of the invention as defined in the following claims.

What is claimed is:

1. A test apparatus comprising:
    transceivers suitable for providing, in a training mode and to a global de-skew circuit, first timing information obtained by delaying a first data signal in a range of up to a preset unit interval based on a clock signal, for receiving, in the training mode and from the global de-skew circuit, second timing information corresponding to timing differences between a slowest of the transceivers and remaining transceivers, and for providing, in an operation mode, compensation data to a plurality of DUTs (Devices Under Test) at the same time, the compensation data being obtained by delaying a second data signal by multiples of the preset unit interval in response to the second timing information; and
    the global de-skew circuit suitable for receiving, in the training mode and from the transceivers, the first timing information, for calculating, in the training mode, the timing differences between the slowest transceiver and the remaining transceivers in response to the first timing information, and for providing, in the training mode and to the transceivers, the second timing information corresponding to each of the timing differences.

2. The test apparatus of claim 1, wherein each of the transceivers comprises:
    a DLL (Delay Locked Loop) suitable for delaying the first data signal in the range of up to the preset unit interval based on the clock signal in the training mode; and
    a local de-skew circuit suitable for delaying the second data signal by a multiple of the preset unit interval corresponding to the second timing information in the operation mode.

3. The test apparatus of claim 2, wherein each of the transceivers further comprises a phase generator suitable for generating multi-phase clock signals having a phase difference corresponding to the preset unit interval in the training mode, and providing the multi-phase clock signals to the local de-skew circuit in the operation mode.

4. The test apparatus of claim 3, wherein the local de-skew circuit comprises:
    D flip-flops suitable for delaying the second data signal by the multiple of the preset unit interval in response to the second timing information in the operation mode; and
    a clock selector suitable for selecting one of the multi-phase clock signals in response to the second timing information in the operation mode.

5. The test apparatus of claim 2, wherein each of the transceivers further comprises:
    a clock divider suitable for dividing the clock signal at a preset ratio and outputting the divided clock signal;
    a deserializer suitable for deserializing the first data signal delayed by the DLL in response to the clock signal and the divided clock signal; and
    an encoder suitable for providing the first timing information obtained by encoding an output signal of the deserializer to the global de-skew circuit.

6. The test apparatus of claim 2, wherein each of the transceivers further comprises:
    a serializer suitable for serializing the delayed second data signal in response to the clock signal and a phase clock signal selected by the local de-skew circuit;
    a latch suitable for latching an output signal of the serializer in response to the clock signal delayed by the DLL; and
    an output driver suitable for providing the compensation data to the DUT in response to an output signal of the latch.

7. The test apparatus of claim 6, wherein in the operation mode, the DLL delays the clock signal by a delay value locked in the training mode and provides the delayed clock signal to the latch.

8. The test apparatus of claim 1, further comprising:
    a clock generator suitable for generating the clock signal; and
    a data generator suitable for generating the first data signal in the training mode, and for generating the second data signal in the operation mode.

9. A test apparatus comprising:
    transceivers each comprising a DLL suitable for delaying a first data signal in the range of up to a preset unit interval based on a clock signal, an encoder suitable for providing first timing information corresponding to the first data signal delayed by the DLL, and a local de-skew circuit suitable for delaying a second data signal by a multiple of the preset unit interval in response to second timing information; and
    a global de-skew circuit suitable for receiving the first timing information of the transceivers, calculating timing differences between a slowest transceiver and remaining transceivers in response to the first timing information, and providing the second timing information corresponding to each of the timing differences to the local de-skew circuits.

10. The test apparatus of claim 9, wherein the DLL comprises a delay line suitable for delaying the first data signal in a range of up to the preset unit interval.

11. The test apparatus of claim 9, wherein the local de-skew circuit comprises a local circuit suitable for delaying the second data signal by the multiple of the preset unit interval in response to the second timing information.

12. The test apparatus of claim 9, wherein each of the transceivers further comprises a phase generator suitable for generating multi-phase clock signals having a phase difference corresponding to the preset unit interval, and providing the generated signals to the local de-skew circuit.

13. The test apparatus of claim 12, wherein the local de-skew circuit comprises:
    D flip-flops suitable for delaying the second data signal by the multiple of the preset unit interval in response to the second timing information; and
    a clock selector suitable for selecting one of the multi-phase clock signals in response to the second timing information.

14. The test apparatus of claim 9, wherein the first data signal is provided at a period for obtaining timing information of channels corresponding to the transceivers, and the second data signal is provided at a period for testing DUTs at the same time.

* * * * *